(12) United States Patent
Chien

(10) Patent No.: US 7,100,678 B2
(45) Date of Patent: Sep. 5, 2006

(54) PHASE-CHANGE HEAT DISSIPATING DEVICE AND METHOD FOR MANUFACTURING IT

(75) Inventor: Yang-Chang Chien, Tu-Cheng (TW)

(73) Assignee: Hon Hai Precision Industry Co., Ltd., (TW)

( * ) Notice: Subject to any disclaimer, the term of this patent is extended or adjusted under 35 U.S.C. 154(b) by 0 days.

(21) Appl. No.: 11/046,617

(22) Filed: Jan. 28, 2005

(65) Prior Publication Data

US 2005/0205242 A1 Sep. 22, 2005

(30) Foreign Application Priority Data

Mar. 18, 2004 (CN) .................. 2004 2 0043898 U

(51) Int. Cl.
*F28D 15/02* (2006.01)

(52) U.S. Cl. ............... 165/104.22; 165/104.26

(58) Field of Classification Search ........... 165/104.22, 165/104.25, 104.28, 104.26; 361/700, 704; 257/714; 174/15.2
See application file for complete search history.

(56) References Cited

U.S. PATENT DOCUMENTS

| | | | | |
|---|---|---|---|---|
| 3,517,730 A | * | 6/1970 | Wyatt | 165/272 |
| 3,605,878 A | * | 9/1971 | Coleman | 165/272 |
| 4,108,239 A | | 8/1978 | Fries | |
| 4,423,768 A | * | 1/1984 | Edelman et al. | 165/84 |
| 4,986,348 A | * | 1/1991 | Okayasu | 165/104.24 |
| 5,076,352 A | | 12/1991 | Rosenfeld et al. | |
| 6,425,440 B1 | * | 7/2002 | Tsenter et al. | 165/104.12 |
| 6,684,941 B1 | * | 2/2004 | Cao et al. | 165/104.25 |
| 6,983,790 B1 | * | 1/2006 | Ippoushi et al. | 165/104.22 |
| 2005/0178529 A1 | * | 8/2005 | Suzuki | 165/80.4 |

FOREIGN PATENT DOCUMENTS

JP 6-120384 * 4/1994 ............ 165/104.25

* cited by examiner

*Primary Examiner*—Teresa J. Walberg
(74) *Attorney, Agent, or Firm*—Morris Manning & Martin LLP; Tim Tingkang Xia, Esq.

(57) ABSTRACT

A phase-change heat dissipating device includes a hollow tube and a driving member connected to the tube. The tube has a vaporizing portion and a condensing portion and contains working fluid therein. The driving member includes a number of shrinkable chambers serially connected together to drive the working fluid to flow.

14 Claims, 3 Drawing Sheets

PHASE-CHANGE HEAT DISSIPATING DEVICE AND METHOD FOR MANUFACTURING IT

BACKGROUND OF THE INVENTION

1. Field of the Invention

The present invention relates to a phase-change heat dissipating device and a method for manufacturing it, and more particularly to a phase-change heat dissipating device with an excellent circulation of working liquid to improve a heat dissipation efficiency of the heat dissipating device, and a method for manufacturing the heat dissipating device.

2. Description of Related Art

As we know, a heat pipe is a conducting device which realizes conduction with working liquid therein, taking advantage of high conduction and good isothermal character. Therefore, it is widely used.

For these years, with the rapid development of electric technology, heat generated by electrical component increases highly. Therefore, phase-changed heat dissipating devices having good heat transfer performance have been widely used.

As shown in FIG. 5, commonly, a heat pipe comprises a sealed container 11 with internal walls coated with a capillary wick structure 4 that is filled with working fluid 13. The heat dissipating device 10 is commonly filled up the working liquid 13 after pressing the heat pipe to be vacuum. Then the container 11 is sealed when the wick structure 4 is fully filled with the working liquid 13. The heat pipe comprises a vaporizing portion 10a, an adiabatic portion and a condensing portion 10b. When the heat pipe absorbs heat at the vaporizing portion 10a thereof, working liquid 13 is vaporized to vapor, and a pressure gradient is formed in the heat pipe. This pressure gradient forces the vapor to flow from the vaporizing portion 10a to the condensing portion 10b where the vapor condenses and gives out its latent heat. The working fluid 13 is then returned back to the vaporizing portion 10a of the heat pipe via capillary forces developed in the wick structure 4.

A main function of the wick structure 4 in above circulation is to stimulate the return of the working liquid 13 to the vaporizing portion 10a. Commonly, sintered power and screen mesh are applied into a pipe to act as a wick structure. Another type of wick structure pipe is a grooved tube. However, the grooved tube is in high cost of the die and machine. It is difficult for the screen mesh to realize complete autoimmunization; thus, manpower cost is much high. A problem for the sintered power is that it needs a costly vacuum sinter furnace.

Therefore, it is desired to design a heat pipe which can improve heat dissipation efficiency and reduce manufacturing cost thereof.

SUMMARY OF THE INVENTION

Accordingly, an object of the present invention is to provide a phase-change heat dissipating device which has improved heat dissipation efficiency.

Another object of the present invention is to provide a phase-change heat dissipating device having a low manufacturing cost.

A further object of the present invention is to provide a method for manufacturing the above-mentioned heat dissipating device.

In order to achieve the first two objects set out above, a phase-change heat dissipating device in accordance with the present invention comprises a hollow tube and a driving member. The tube comprises a vaporizing portion and a condensing portion and contains working fluid therein. The driving member comprises a plurality of chambers serially connected together. The driving member is connected to the tube to form a loop for circulation of the working fluid, and each of the chambers is shrinkable under control of an electrical signal in order to discharge the working fluid therefrom.

Other objects, advantages and novel features of the present invention will become more apparent from the following detailed description when taken in conjunction with the accompanying drawings, in which:

DETAILED DESCRIPTION OF THE INVENTION

Figure 1:
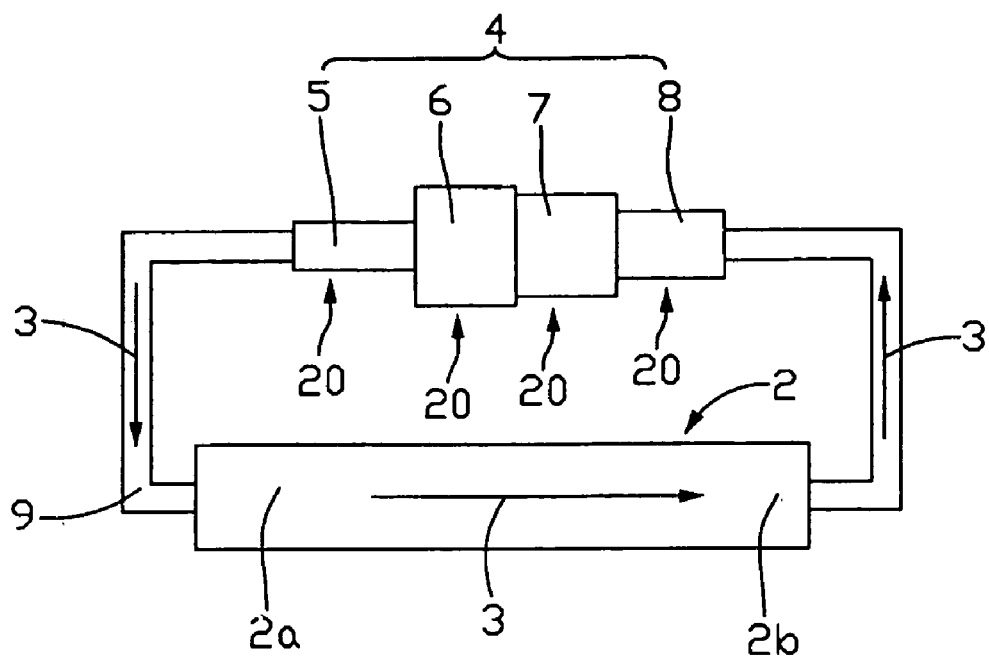
FIGS. 1–4 are plan views of a phase-change heat dissipating device in accordance with a preferred embodiment of the present invention.

Reference will now be made to the drawing figures to describe the present invention in detail.

FIGS. 1–4 show a phase-change heat dissipating device in accordance with the preferred embodiment of the present invention, for removing heat from computer electronic devices such as CPUs (not shown). The heat dissipating device comprises a hollow tube 2, working fluid 3 filled in the tube 2, and a driving member 4.

The tube 2 is made of copper or other metal materials in accordance with different needs, such materials including aluminum, steel, stainless steel, iron, nickel, titanium alloy etc. A radial cross section of the tube 2 is round in the preferred embodiment of the present invention, but it can be other shapes such as elliptical, square, rectangular or triangular. The tube 2 comprises a vaporizing portion 2a and a condensing portion 2b. Two conduits 9 are attached to opposite ends of the tube 2 by means of O-shaped rings. The conduits 9 are made of metal or rubber.

The driving member 4 connected to the tube 2 via the conduits 9, and drives working fluid 3 from the condensing portion 2b to the vaporizing portion 2a through the conduits 9. The driving member 4 comprises four different sizes of chambers 5, 6, 7 and 8, which are made of piezoelectric material. The piezoelectric material is a compound of lead, zirconium, acid and titanium. The piezoelectric material is provided to produce driving force by physical deformation thereof, under the control of corresponding electrical signals. The four chambers 5, 6, 7, 8, are all column-shaped, and are serially connected together via O-shaped rings made of rubber. The rings are used to compartmentalize the chambers 5, 6, 7, 8, and prevent the working fluid 3 from leaking. Two ends of the conduits 9 are also joined to the chambers 5, 8 by O-shaped rings. Each of the chambers 5, 6, 7, 8, is controlled by an alternating current (AC) electrical signal 20. A phasic interval of the adjacent AC electrical signals 20 is 90 degrees every interval time T. The corresponding chambers 5, 6, 7, 8 have the same phasic interval according to the AC electrical signals 20 applied thereto at the same time. The time T is a period during which the working fluid 3 flows from one of the chambers 6, 7, 8 to a next one of the chambers 5, 6, 7. When inputting the AC electrical signals 20 to the chambers 5, 6, 7, 8, the volume of each chamber 5, 6, 7, 8 is periodically changed with physical deformation thereof. Then the chambers 6, 7, 8 drive the working fluid 3 therein to a next one of the chambers 5, 6, 7, with the chamber 5 driving the working fluid 3 therein to the corresponding conduit 9.

The working fluid 3 is liquid, such as water, ammonia, carbinol or heptane. Particles of thermally conductive materials such as copper powder are added to the working fluid 3 to improve the conduction capability of the heat dissipating device. The working fluid 3 is chosen to be water in accordance with the preferred embodiment of the present invention.

As shown in FIG. 1, the working fluid 3 of the vaporizing portion 2a is vaporized into vapor when the vaporizing portion 2a of the rube 2 absorbs heat. The vapor flows to the condensing portion 2b of the tube 2 with the pressure gradient forces, and condenses into the working fluid 3 and gives out its latent heat of vaporization. The working fluid 3 flows into chamber 8 via the conduits 9. The chamber 8 is shrunk according to the AC electrical signal 20 applied thereto at a time T. The chambers 5, 6, 7 are also correspondingly changed according to the AC electrical signal 20 applied thereto. After the time T, the chambers 5, 6, 7, 8 enter a next working state, as shown in FIG. 2.

Figure 2:
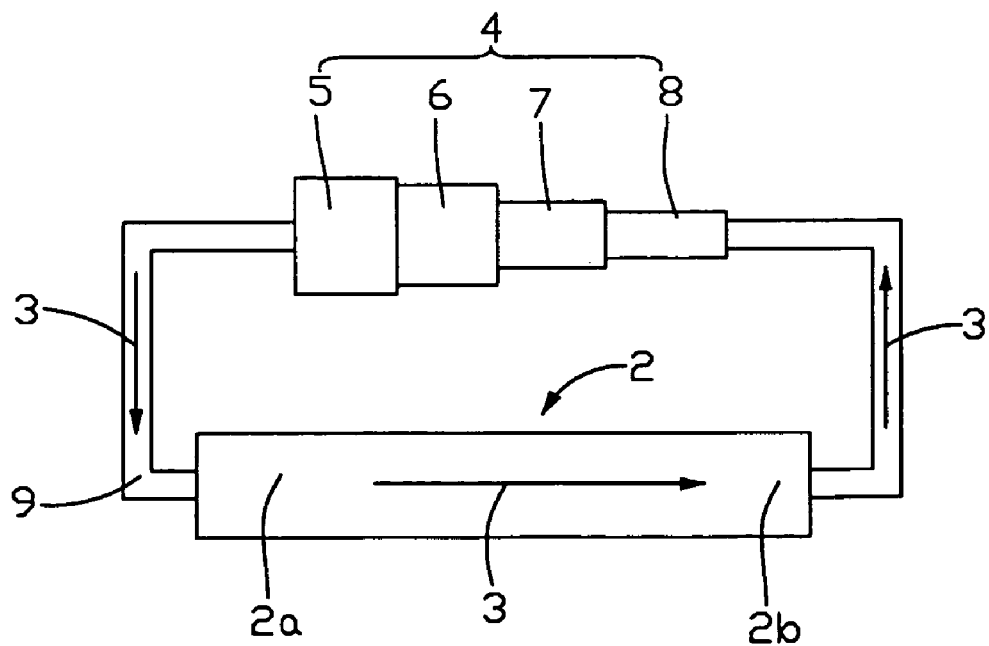

As shown in FIG. 2 after the time T, the working fluid 3 has been forced by the chamber 8 to flow into the chamber 7 next to the chamber 8. The chamber 7 is shrunk according to the AC electrical signal 20 applied thereto at a time 2T. The chambers 5, 6, 8 are also correspondingly changed according to the AC electrical signal 20 applied thereto. After the time 2T, all of the chambers 5, 6, 7, 8 enter a next working state, as shown in FIG. 3.

Figure 3:
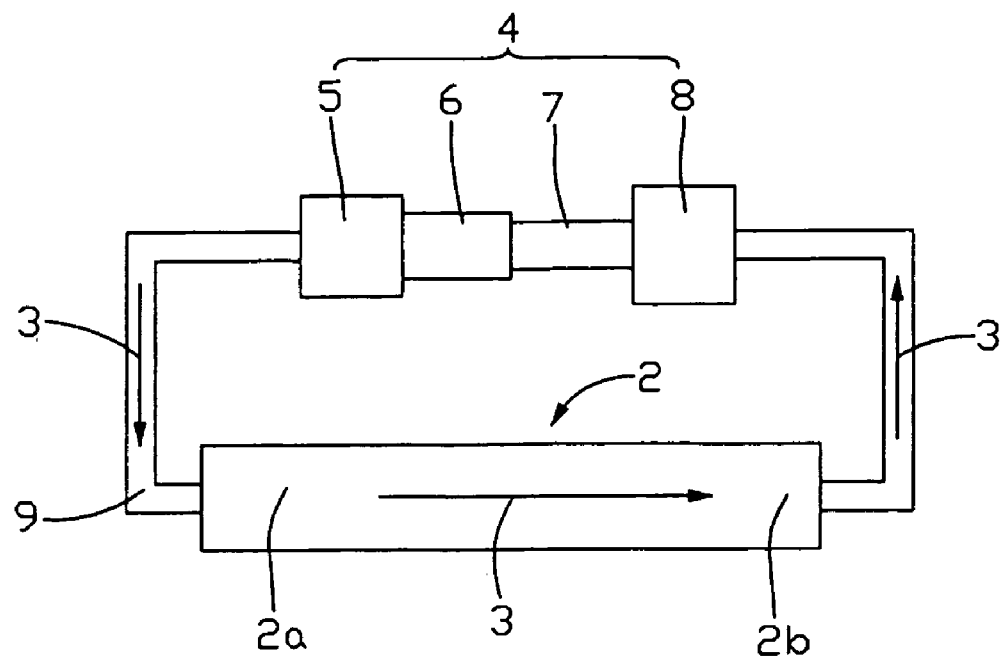

As shown in FIG. 3, after the time 2T, the working fluid 3 has been forced by the chamber 7 to flow into the chamber 6 next to the chamber 7. The chamber 6 is shrunk according to the AC electrical signal 20 applied thereto at a time 3T. The chambers 5, 7, 8 are also correspondingly changed according to the AC electrical signal 20 applied thereto. After the time 3T, all of the chambers 5, 6, 7, 8 enter a next working state, as shown in FIG. 4.

Figure 4:
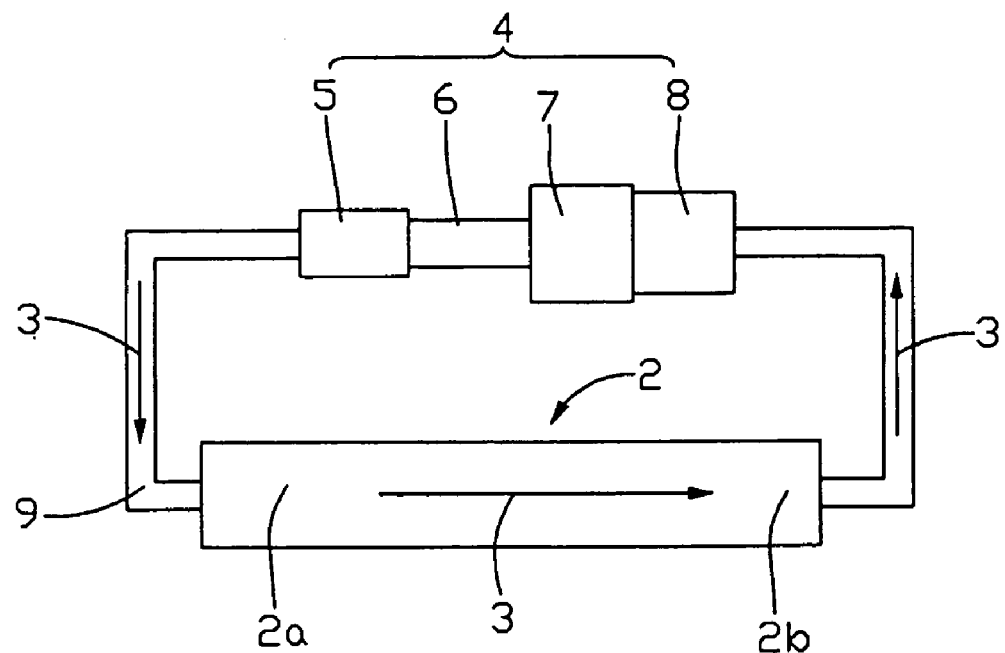
Figure 5:
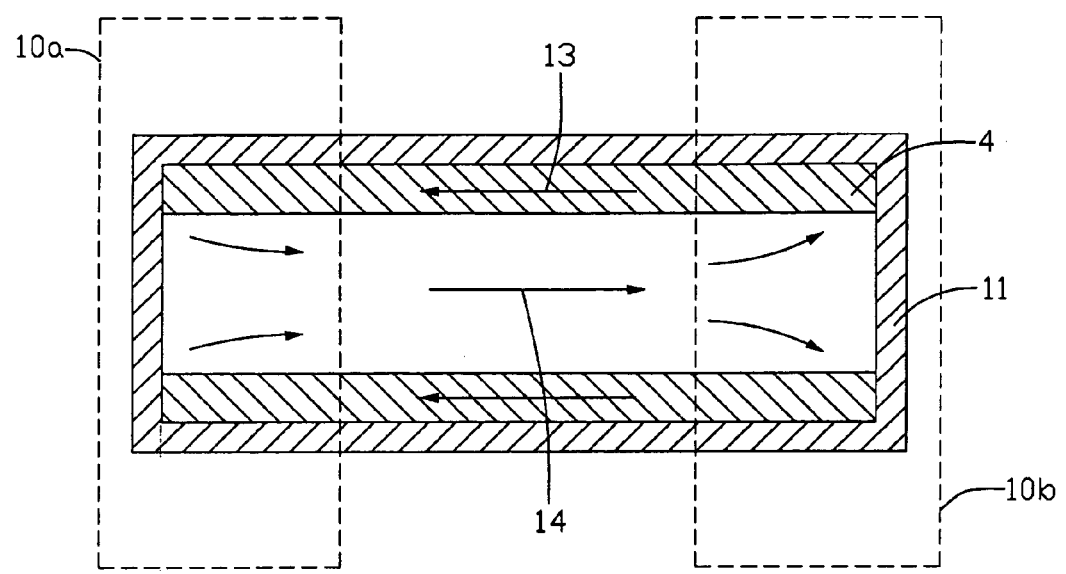
FIG. 5 is a cross-sectional view of a conventional heat dissipation device.

As shown in FIG. 4, after the time 3T, the working fluid 3 has been forced by the chamber 6 to flow into the chamber 5 next to the chamber 6. The chamber 5 is shrunk according to the AC electrical signal 20 applied thereto at a time 4T. The chambers 6, 7, 8 are also correspondingly changed according to the AC electrical signal 20 applied thereto, After the time 4T, all of the chambers 5, 6, 7, 8 enter a next working state, as shown in FIG. 1.

As shown in FIG. 1, after the time 4T, the chamber 5 becomes smaller than what it was at the time 4T. The working fluid 3 is forced to flow to the vaporizing portion 2a of the tube 2 on account of the deflation contraction of the chamber 5. Then the working fluid 3 arriving at the vaporizing portion 2a begins a next new circulation.

In manufacturing the heat dissipating device, the tube 2 is filled with the working fluid 3. Two conduits 9 are respectively attached to opposite ends of the tube 2 by O-shaped rings. A driving member 4 is connected between the conduits 9, and thereby communicates with the tube 2 via the conduits 9 to form a hermetical circulation path. The AC electrical signals 20 are provided to the driving member 4. The driving member 4 is deformed and thus drives the working fluid 3 to flow.

Since the working fluid 3 is forced to circulate by the driving member 4 provided, the flow of the working fluid 3 is enhanced, even without a wick structure being employed in the heat dissipating device. This saves the cost that would otherwise be incurred for using a wick structure, so that the whole manufacturing cost of the heat dissipating device is decreased in comparison with conventional heat pipes.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A phase-change heat dissipating device for dissipating heat from a heat-generating component, comprising:
   a hollow tube comprising a vaporizing portion and a condensing portion;
   working fluid; and
   a driving member comprising a plurality of chambers serially connected together;
   wherein the driving member is connected to the tube to form a loop for circulation of the working fluid, and each of the chambers is configured to be shrinkable under control of an electrical signal in order to discharge a corresponding portion of the working fluid therefrom.

2. The phase-change heat dissipating device of claim 1, wherein the chambers are made of piezoelectric material.

3. The phase-change heat dissipating device of claim 1, wherein the driving member comprises four chambers.

4. The phase-change heat dissipating device of claim 1, wherein each of the chambers is configured to be shrunk according to an alternating current (AC) electrical signal applied thereto.

5. The phase-change heat dissipating device of claim 1, wherein a phasic interval of the electrical signal applied to two adjacent chambers is 90 degrees.

6. The phase-change heat dissipating device of claim 1, further comprising two conduits connecting the driving member to the tube.

7. A method for manufacturing a phase-change heat dissipating device, comprising steps of:
   providing a hollow tube having working fluid contained therein, and a driving member;
   providing conduits connecting the driving member to the tube to form a loop; and
   providing electrical signals the driving member to allow the driving member being size-changeable to drive the working fluid to circulate in the loop under control of the electrical signals.

8. The method as claimed in claim 7, wherein the tube comprises a vaporizing portion and a condensing portion.

9. The method as claimed in claim 7, wherein the driving member comprises four shrinkable chambers serially connected together.

10. The method as claimed in claim 9, wherein the driving member drives the working fluid to flow from one chamber into a next adjacent chamber by shrinking of said one chamber.

11. The method as claimed in claim 9, wherein each of the chambers is shrunk according to an alternating current (AC) electrical signal applied thereto.

12. A heat dissipating device for dissipating heat from a heat-generating component, comprising:
   a hollow tube used to thermally contact said heat-generating component and gain heat from said heat-generating component at one portion thereof, and dissipate said heat at another portion thereof;

working fluid installed in said hollow tube and used to heat-exchange with said hollow tube at said one and another portions, and to flow within said hollow tube from said one portion to said another portion; and a driving member establishing another flow path from said another portion of said hollow tube to said one portion of said hollow tube outside said hollow tube, and comprising at least two fluid-containable, volume-variable chambers serially connected to each other, each of said at least two chambers being controlled by periodical alternating current (AC) signals respectively for generating flow-driving force on said working fluid via volume variation of said at least two chambers.

13. The heat dissipating device of claim 12, wherein said at least two chambers are made of piezoelectric material and are electrifiable.

14. The heat dissipating device of claim 12, wherein said one portion is a fluid-vaporizing portion and said another portion is a fluid-condensing portion, and phases of said working fluid within portions of said hollow tube other than said another portion are substantially different from phases of said working fluid within said another flow path established by said driving member.

* * * * *